United States Patent
Li

(10) Patent No.: US 6,954,110 B2
(45) Date of Patent: Oct. 11, 2005

(54) REPLICA CELL FOR RING OSCILLATOR

(75) Inventor: Shenggao Li, Pleasanton, CA (US)

(73) Assignee: Intel Corporation, Santa Clara, CA (US)

(*) Notice: Subject to any disclaimer, the term of this patent is extended or adjusted under 35 U.S.C. 154(b) by 64 days.

(21) Appl. No.: 10/648,919

(22) Filed: Aug. 27, 2003

(65) Prior Publication Data

US 2005/0046495 A1 Mar. 3, 2005

(51) Int. Cl.$^7$ .............................................. H03L 7/00
(52) U.S. Cl. ............................ 331/57; 331/8; 331/17; 331/34; 331/175; 331/177 R; 331/185; 331/186; 327/156; 327/538; 327/543
(58) Field of Search ............................. 331/8, 17, 34, 331/57, 175, 177 R, 185, 186; 327/156–157, 538, 543

(56) References Cited

U.S. PATENT DOCUMENTS 5,936,476 A * 8/1999 Iravani .......................... 331/57
2001/0043123 A1 * 11/2001 Yabe ............................ 331/34

* cited by examiner

Primary Examiner—Michael B. Shingleton
(74) Attorney, Agent, or Firm—Buckley, Maschoff & Talwalkar LLC

(57) ABSTRACT

In some embodiments, a ring oscillator includes a plurality of delay cells coupled in series as a ring, and a replica cell coupled to the delay cells to provide at least one bias signal to the delay cells. The replica cell includes a differential transistor pair formed of a first transistor and a second transistor. The first transistor has a drain terminal and a gate terminal coupled to the drain terminal. The second transistor has a drain terminal and a gate terminal coupled to the drain terminal of the second transistor.

14 Claims, 7 Drawing Sheets

REPLICA CELL FOR RING OSCILLATOR

BACKGROUND

A phase locked loop (PLL) may be employed to clean up phase noise in a reference clock. The voltage controlled oscillator (VCO) for the PLL may be implemented as a ring oscillator formed of several delay cells arranged in series as a ring. Bias signals for the delay cells may be generated by an additional cell that is a replica of the delay cells.

In some applications, the output of the ring oscillator may be coupled to current-mode logic (CML). CML may be preferable to CMOS logic for some applications, because CML operates with differential signaling with a much smaller signal swing than CMOS logic, and therefore may be able to operate at higher speed than CMOS logic. However, the output common mode level of the ring oscillator may not be known or fixed, so that the coupling of the ring oscillator to the CML may present difficulties.

DETAILED DESCRIPTION

Figure 1:
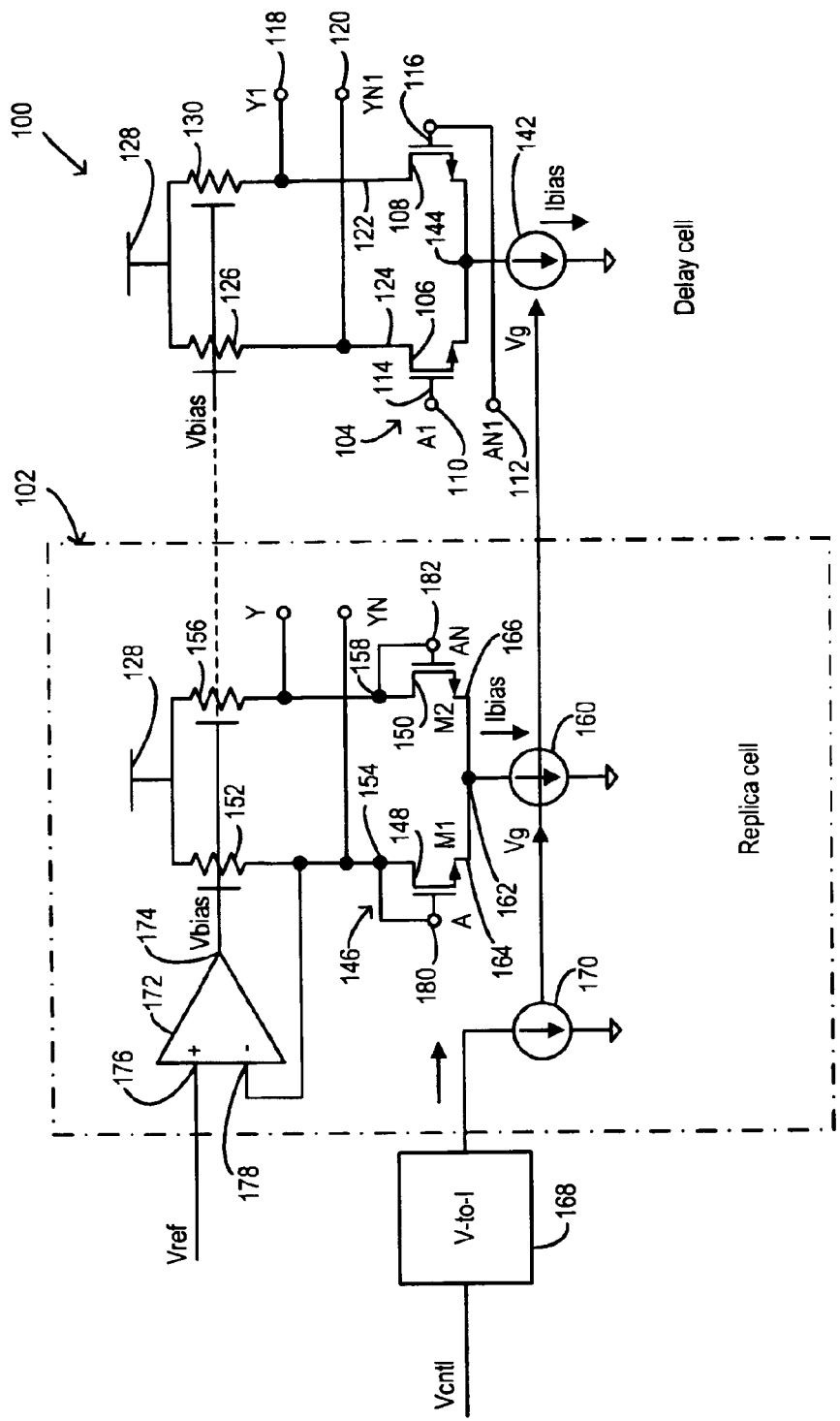
FIG. 1 is a schematic circuit diagram that shows a replica cell provided according to some embodiments for a ring oscillator; a representative delay cell of the ring oscillator is also shown.

FIG. 1 is a schematic circuit diagram that shows a typical delay cell 100 that may be part of a ring oscillator (not shown in FIG. 1) together with a replica cell 102 that may be provided according to some embodiments to provide bias signals for the delay cells of the ring oscillator.

The delay cell 100 includes a differential transistor pair 104 formed of NMOS (n-channel metal-oxide-semiconductor) transistors 106 and 108. The differential inputs A1 (reference numeral 110) and AN1 (reference numeral 112) for the delay cell 100 are respectively coupled to the gate terminal 114 of the transistor 106 and to the gate terminal 116 of the transistor 108. The differential outputs Y1 (reference numeral 118) and YN1 (reference numeral 120) of the delay cell 100 are respectively coupled to the drain terminal 122 of the transistor 108 and to the drain terminal 124 of the transistor 106.

An active resistor 126 is coupled between the drain terminal 124 of the transistor 106 and the power supply 128. An active resistor 130 is coupled between the drain terminal 122 of the transistor 108 and the power supply 128.

Figure 2:
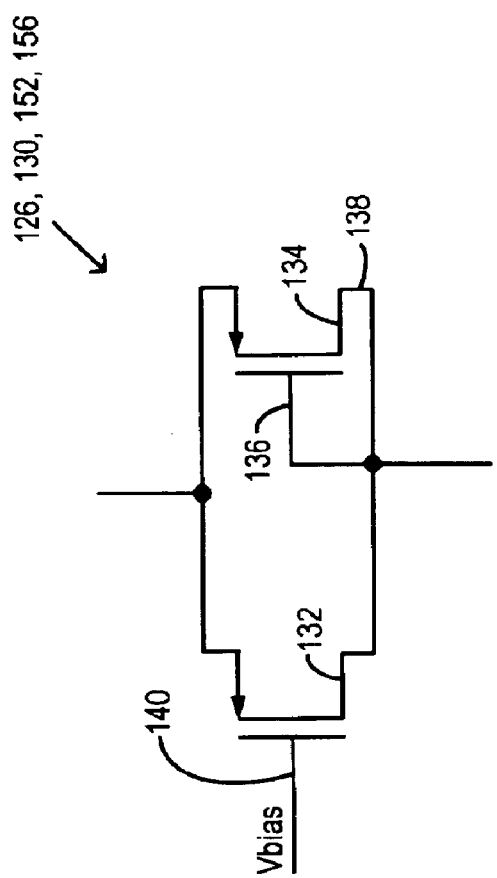
FIG. 2 is a schematic circuit diagram of a typical one of active resistors that are included in the circuitry of FIG. 1.

The active resistors 126, 130 may be identical to each other; a typical one of the active resistors is illustrated in FIG. 2. The active resistor shown in FIG. 2 includes a PMOS (p-channel metal-oxide-semiconductor) transistor 132 coupled in parallel with another PMOS transistor 134 that is diode-connected (i.e., with its gate terminal 136 tied to its drain terminal 138). A bias signal for the active resistor is provided to the gate terminal 140 of the transistor 132.

A variable current source 142 is coupled to a tail node 144 of the differential transistor pair 104 to supply a bias current for the differential pair. The amount of bias current provided by the current source 142 is controlled by a control signal Vg supplied to the current source 142.

The replica cell 102 replicates the delay cell 100, in addition to having some other features.

The replica cell 102 includes a differential transistor pair 146 formed of NMOS transistors M1 (reference numeral 148) and M2 (reference numeral 150). The replica cell 102 also includes an active resistor 152 connected between the power supply 128 and the drain terminal 154 of the transistor 148, and an active resistor 156 connected between the power supply 128 and the drain terminal 158 of the transistor 150. The active resistors 152, 156 may be identical to the active resistors 126, 130 of the delay cell 100 and thus each of the active resistors 152, 156 may have the structure illustrated in FIG. 2 and as described above in connection with FIG. 2.

Also included in the replica cell 102 is a current source 160 connected to the tail node 162 of the differential transistor pair 146 to supply a bias current for the differential pair 146. (I.e., the current source 160 is connected in common to respective source terminals 164, 166 of the transistors 148, 150.) Like the current source 142 of the delay cell 100, the current source 160 of the replica cell 102 may be a variable current source, such that the amount of bias current provided by the current source 160 is controlled by a control signal Vg supplied to the current source 160. The control signal Vg which is supplied to both the variable current source 160 of the replica cell 102 and to the variable current source 142 of the delay cell 100 may be derived from a control signal Vcntl via a voltage-to-current converter 168 and via another current source 170 which is part of the replica cell 102. (The control signal Vcntl may be an input signal for the ring oscillator of which the delay cell 100 and the replica cell 102 are a part.)

The replica cell 102 further includes an operational amplifier 172. The operational amplifier 172 has an output 174 that is coupled to the respective gate terminals 140 (FIG. 2) of the respective transistors 132 of the active resistors 152, 156 (FIGS. 1 and 2). Thus the operational amplifier provides a bias signal level Vbias to control the active resistors 152, 156. (The output 174 of the operational amplifier 172 is also coupled to the respective gate terminals 140 of the respective transistors 132 of the active resistors 126, 130 of the delay cell 100, thereby providing the bias signal level Vbias to control the active resistors 126, 130.)

The operational amplifier 172 also has a non-inverting input 176 that is coupled to receive a reference signal level Vref, and an inverting input 178 that is coupled to the drain terminal 154 of the transistor 148.

Turning again to the transistors 148, 150 of the differential transistor pair 146 of the replica cell 102, it will be observed that the gate terminal 180 of the transistor 148 is coupled to the drain terminal 154 of the transistor 148. In like manner, the gate terminal 182 of the transistor 150 is coupled to the drain terminal 158 of the transistor 150. This is contrary to the arrangement of a previously proposed replica cell, in which the gate of one transistor of the differential pair is tied to the power supply, and the gate of the other transistor of the differential pair is tied to ground. With the previously proposed arrangement, one of the transistors draws all of the bias current, and the other transistor is turned off, so that the replica cell sets theoretical maximum and minimum output levels for the delay cell. In practice, if the ring oscillator operates at high frequency, the delay cell would not reach the theoretical maximum and minimum output levels.

With the arrangement shown in FIG. 1 for the replica cell 102, the level set for Vref (level provided to the non-inverting input 176 of the operational amplifier 172) is also present at the drain terminal 154 of the transistor 148. Further, because of the balanced arrangement of the replica cell 102, equal current (half of Ibias) flows through both of the transistors 148, 150, and through both of the active resistors 152, 156. Consequently, the level at the drain terminal 158 of the transistor 150 is equal to the level at the drain terminal 154 of the transistor 148, and thus equal to Vref. Accordingly, Vref sets the operating point of the replica cell 102 and effectively sets the common mode voltage for the delay cell 100. More specifically, at the point in the operating cycle of the delay cell 100 at which equal bias current flows through transistors 106, 108, the output levels of the terminals Y1 (reference numeral 118) and YN1 (reference numeral 120) are equal and correspond to the common mode output voltage of the delay cell 100. Since the replica cell 102 also has balanced output, the replica cell 102 exactly replicates the delay cell 100, and the outputs at nodes 154, 158 of the replica cell, which are set by and correspond to the value Vref, are the same as the common mode output level of the delay cell 100. Thus Vref can control the common mode output voltage of the delay cell 100 and can be set to a value equal to a predefined common mode voltage for downstream CML.

Figure 3:
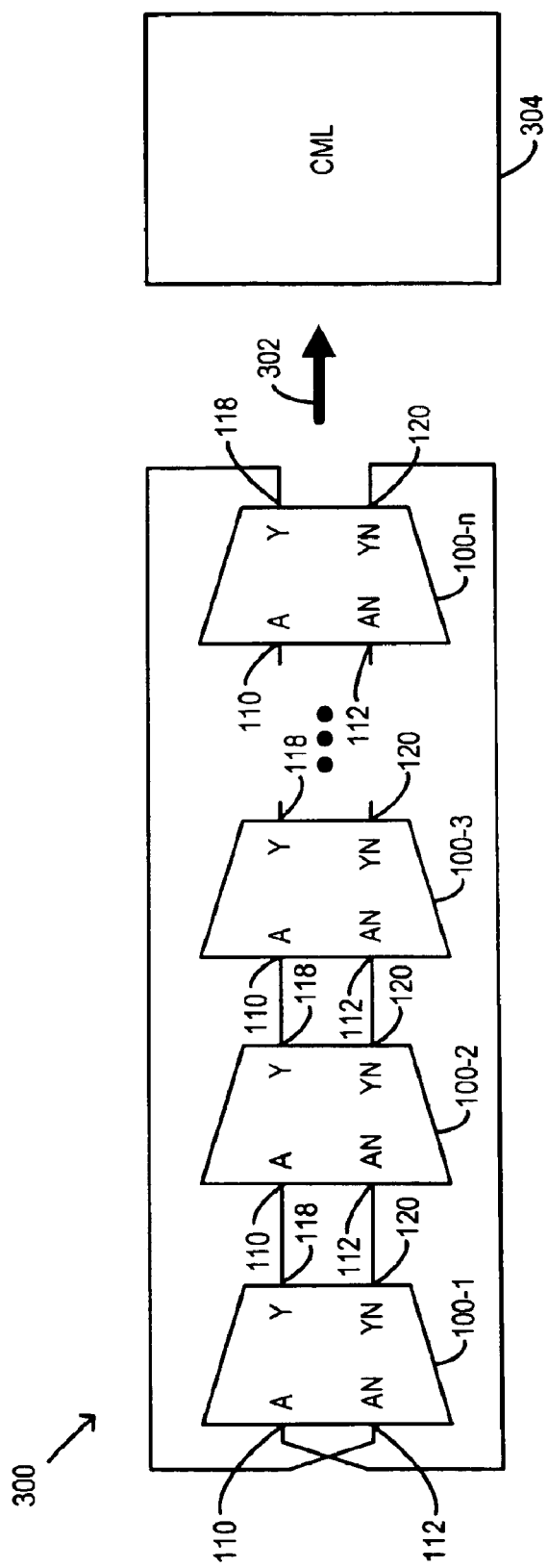
FIG. 3 is a block diagram that shows a ring oscillator according to some embodiments, coupled to downstream current-mode logic.

FIG. 3 is a block diagram that schematically illustrates a ring oscillator 300 formed from a plurality of delay cells 100-1 to 100-n. Each of the delay cells 100-1 to 100-n may be like the delay cell 100 illustrated in FIG. 1. (The ring oscillator 300 also includes a replica cell like the replica cell 102, although the replica cell of the ring oscillator 300 is not separately shown in FIG. 3. One may also consider that the ring oscillator is illustrated by FIG. 1, with all but one of the delay cells omitted. Each delay cell 100-1 to 100-n may be coupled to the replica cell 102 to receive bias signals therefrom in the same fashion as illustrated with respect to the delay cell 100 in FIG. 1.) The delay cells 100-1 to 100-n are arranged in series as a ring, with the Y output (reference numeral 118) of each delay cell coupled to the A input (reference numeral 110) of the next delay cell, except that the Y output of the last delay cell 100-n may be coupled to the AN input (reference numeral 112) of the first delay cell 100-1; and the YN output (reference numeral 120) of each delay cell is coupled to the AN input of the next delay cell, except that the YN output of the last delay cell 100-n may be coupled to the A input of the first delay cell 100-1. An input signal for the ring oscillator, although not indicated in FIG. 3, may be provided as the signal Vcntl (FIG. 1) which is coupled to the variable current sources 160 (of the replica cell) and 142 (of the delay cells) via the voltage-to-current converter 168 and the current source 170, to vary the amount of bias current Ibias for the replica cell and the delay cells.

In FIG. 3, the arrow 302 represents coupling of the output signal of the ring oscillator 300 (i.e., the differential output from the last delay cell 100-n) to downstream current-mode logic (CML) 304. Because the common mode output voltage of the ring oscillator 300 is known (set by Vref, FIG. 1), the coupling of the ring oscillator 300 to the CML 304 may be done in a straightforward manner, and the operation of the CML may be predictable.

Although FIG. 3 suggests that the number n of delay stages in the ring oscillator 300 may be four or more, in other embodiments the number n of delay stages may be any number greater than 1. The total gain of the delay stages together is sufficiently high to result in oscillation in the output of the ring oscillator. In some embodiments, the ring oscillator 300 may have a center frequency of substantially 622 MHz.

In operation, the ring oscillator 300 provides an oscillating output. The reference level Vref applied to the non-inverting input 176 of the operational amplifier 172 is selected to set the common mode output voltage for the ring oscillator. An input signal for the ring oscillator (which may be an error signal in a phase locked loop of which the ring oscillator is a part) is applied as Vcntl to the voltage-to-current converter 168 and is translated to a control signal Vg which is applied to the variable current sources 106 (of the replica cell 102) and 142 (of the delay cells 100) to vary the bias current for the replica cells and the delay cells, thereby changing the frequency of oscillation of the ring oscillator 300.

Figure 4:
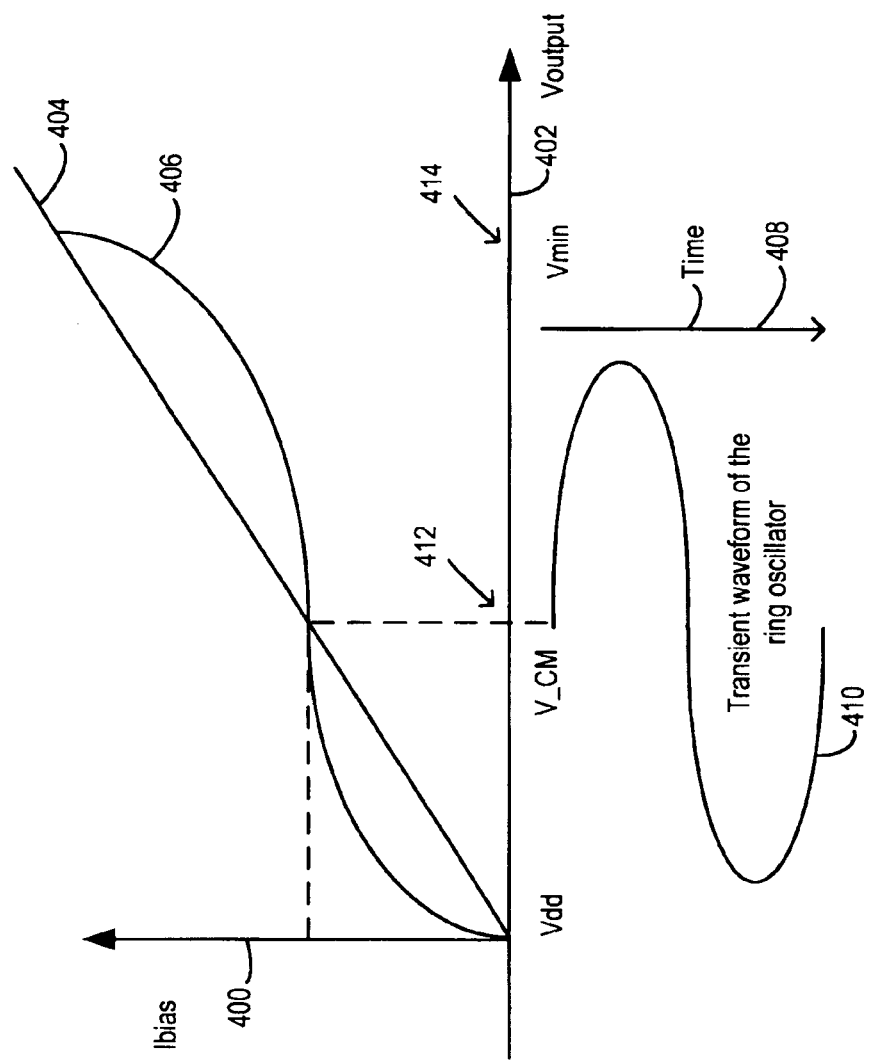
FIG. 4 is graphically illustrates an operating characteristic of the replica cell shown in FIG. 1.

FIG. 4 graphically illustrates operation of the replica cell 102 and of the delay cells 100. In FIG. 4 the first vertical axis 400 represents the amount of current passing through one of the transistors of the differential pair of the replica cell or delay cell. The horizontal axis 402 (with values decreasing from left to right, and the power supply voltage Vdd indicated at the intersection of the axes 400, 402) represents the output voltage of the transistor (the level at the drain terminal of the transistor) which varies inversely with the amount of current through the active resistor coupled to the drain terminal. The straight line 404 represents an idealized linear characteristic of the active resistor, and the curve 406 represents a more realistic non-linear characteristic of the active resistor.

The second vertical axis 408 in FIG. 4 represents the passage of time, and the curve 410 indicates a sinusoidal cycle of the oscillating output of the ring oscillator, which corresponds to the output of the last delay cell and is indicative of the operating voltage range of the delay cells. The value V_CM shown at 412 on the horizontal axis 402 is the common mode voltage for the ring oscillator, as set by the value of Vref applied to the operational amplifier of the replica cell. V_CM corresponds to the operating point of the transistors of the replica cell and is at the center of the operating range of the delay cells. By contrast, in the previously proposed replica cell with one transistor gate held to the power supply and the other transistor gate grounded, the operating point of the replica cell is at Vmin (reference numeral 414), which is outside of the operating range of the delay cells. With the non-linearity of the active resistors, the previously proposed replica cell did not result in a predictable or easily settable common mode output voltage for the ring oscillator. Consequently, there could be difficulties in coupling the ring oscillator to downstream CML, and the operation of the CML might prove to be unpredictable. The arrangement of the replica cell shown in FIG. 1 solves this problem, by tying the gate of each transistor of the differential pair to the transistor's drain, resulting in balanced operation of the replica cell. As a result, the operating point of the replica cell is set by Vref, and governs the common mode output voltage of the ring oscillator, so that there is no need for level shifting in the downstream CML.

Also, with the arrangement of the replica cell shown in FIG. 1 it is not necessary to contact the output of the delay cell to sense the common mode output level of the delay cell. This is advantageous since sensing at the delay cell output may adversely affect circuit performance.

The level of the bias current Ibias provided by the current source 142 in the delay cell may (subject to fluctuations to adjust the oscillator frequency) be set so that the fall time of the output signal matches the rise time. The rise time is a function of the RC characteristic at the output, whereas the fall time depends on an integral of Ibias/C.

In some alternative embodiments, in both the delay and replica cells the differential transistor pair may be formed of PMOS (p-channel metal-oxide-semiconductor) transistors, the variable resistors may be connected between the PMOS transistors and ground, and the current source may be connected between the PMOS transistors and the power supply.

In some other alternative embodiments, the input signal Vcntl may be provided directly as the bias signals to the variable resistors of the replica and delay cells, and the output of the operational amplifier may control the variable current sources of the replica and delay cells.

Figure 5:
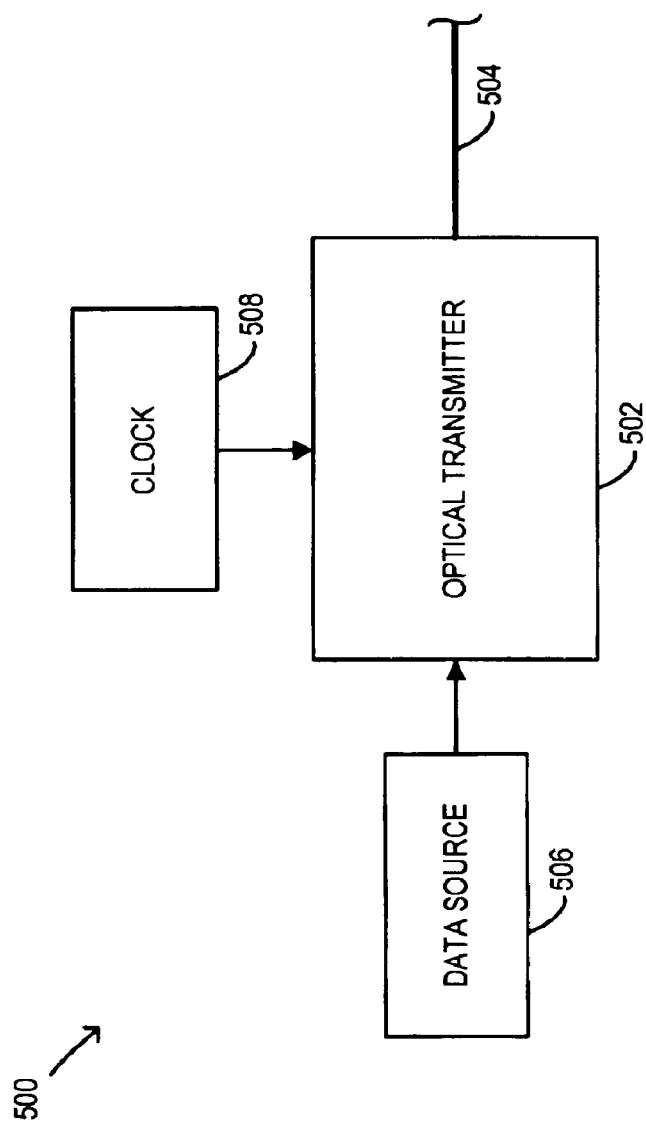
FIG. 5 is a block diagram that illustrates a data transmission circuit according to some embodiments.

FIG. 5 is a block diagram of a system 500 that may incorporate a ring oscillator such as the ring oscillator 300 described above in connection with FIGS. 1–3. The system 500 includes an optical transmitter 502 coupled to an optical fiber 504. The optical transmitter 502 is coupled to a data source 506 (e.g., a server or other type of computer). The optical transmitter 502 transmits data received from the data source 506 in the form of optical signals over the optical fiber 504.

The system 500 also includes a clock circuit 508 which is coupled to the optical transmitter 502 and provides a clock signal to the optical transmitter 502. The clock signal from the clock circuit 508 may be used for data multiplexing by the optical transmitter. As will be seen, the clock circuit 508 may include a ring oscillator of the type described above in connection with FIGS. 1–3.

In other embodiments, the clock circuit 508 may be coupled to provide a clock signal to an optical receiver in addition to or instead of the optical transmitter 502.

Figure 6:
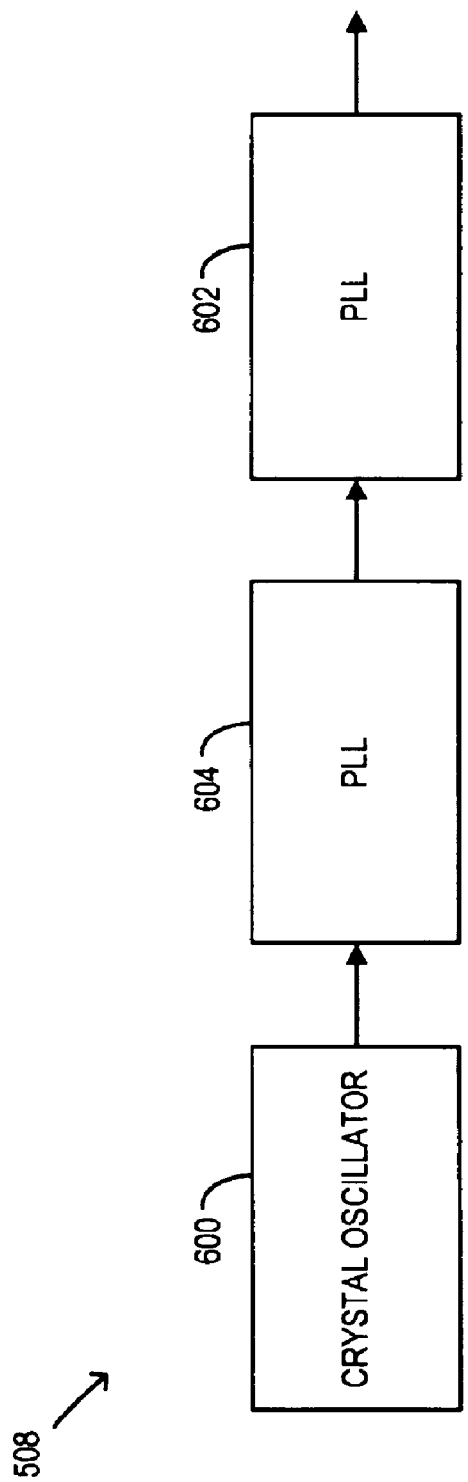
FIG. 6 is a block diagram that illustrates a clock circuit that is part of the data transmission circuit of FIG. 5.

FIG. 6 is a block diagram that shows some details of the clock circuit 508. The clock circuit 508 may include a crystal oscillator 600, which may in some embodiments be a relatively low cost, low quality oscillator. The clock circuit 508 may also include a phase locked loop (PLL) 602 which operates at the desired frequency of the output clock signal (e.g., 10 GHz). In addition, the clock circuit 508 may further include another PLL 604 that is coupled between the oscillator 600 and the PLL 602 to clean up phase noise generated by the oscillator 600. The PLL 604 operates at the nominal frequency of the oscillator 600, which may be 622 MHz in some embodiments. As will be seen, the PLL 604 may incorporate a ring oscillator as described above in connection with FIGS. 1–3 as a VCO (voltage controlled oscillator).

Figure 7:
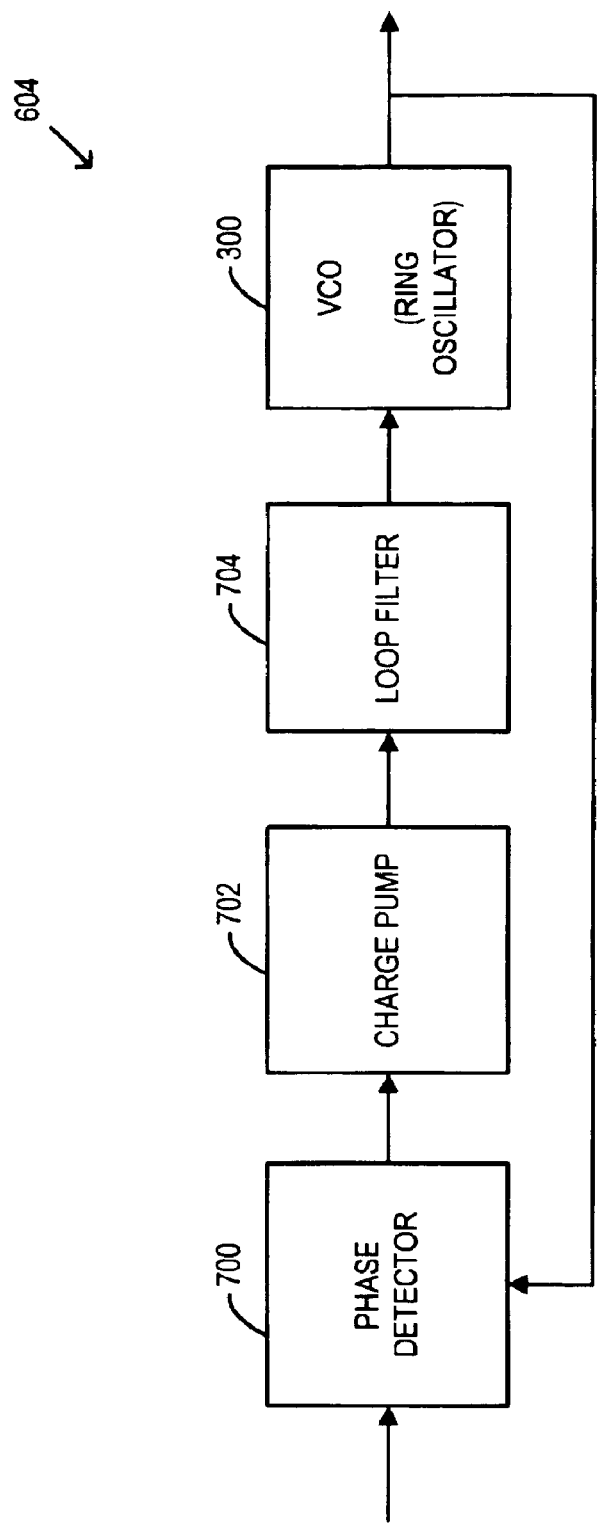
FIG. 7 is a block diagram of a phase locked loop that is part of the clock circuit of FIG. 6 and that incorporates the ring oscillator of FIG. 3.

FIG. 7 is a block diagram of the phase locked loop 604 shown in FIG. 6, as provided in accordance with some embodiments.

The PLL 604 includes a phase detector 700 which receives the signal output from the oscillator 600 (FIG. 6) and which also receives a feedback signal which is described below. Continuing to refer to FIG. 7, the phase detector 700 detects a difference in phase between the input signal and the feedback signal and provides an output based on the detected phase difference.

The PLL 604 further includes a charge pump 702, which is coupled to receive the output of the phase detector. The output of the charge pump 700 is filtered by a loop filter (low-pass filter) 704 and the resulting filtered signal is provided as a control input (filtered error signal) to the VCO (i.e., the ring oscillator 300, described above) for the PLL 604. More specifically, the filtered output from the loop filter 704 may be provided as the signal Vcntl shown in FIG. 1. Referring once more to FIG. 7, the signal output from the ring oscillator 300 is fed back to the phase detector 700 and also is provided as the output of the PLL 604 as an input to the PLL 602 (FIG. 6).

Except for the ring oscillator 300, all of the components of the PLL 604 may be conventional.

Thus, in some embodiments, a ring oscillator includes a plurality of delay cells coupled in series as a ring, and a replica cell coupled to the delay cells to provide at least one bias signal to the delay cells. The replica cell includes a differential transistor pair formed of a first transistor and a second transistor. The first transistor has a drain terminal and a gate terminal coupled to the drain terminal. The second transistor has a drain terminal and a gate terminal coupled to the drain terminal of the second transistor.

In other embodiments, a method includes providing a ring oscillator that includes a plurality of delay cells and a replica cell coupled to the delay cells to provide at least one bias signal to the delay cells. The replica cell includes a differential transistor pair. Each transistor of the differential transistor pair has its drain terminal connected to its gate terminal. The replica cell also includes an operational amplifier. The operational amplifier has an inverting input coupled to the drain terminal of one of the transistors of the differential transistor pair. The method further includes applying a reference signal level to a non-inverting input of the operational amplifier to set a common mode output voltage of the ring oscillator.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. A ring oscillator comprising:

a plurality of delay cells coupled in series as a ring; and a replica cell coupled to the delay cells to provide at least one bias signal to the delay cells, the replica cell including a differential transistor pair formed of a first transistor and a second transistor, the first transistor having a first terminal and a second terminal coupled to the first terminal, the second transistor having a first terminal and a second terminal coupled to the first terminal of the second transistor, the first transistor also having a third terminal and the second transistor also having a third terminal coupled to the third terminal of the first transistor;

wherein the replica cell further includes:

a first active resistor connected between a power supply and the drain terminal of the first transistor; and a second active resistor connected between the power supply and the drain terminal of the second transistor;

wherein:

the first active resistor includes a third transistor coupled in parallel with a fourth transistor that is diode-connected; and the second active resistor includes a fifth transistor coupled in parallel with a sixth transistor that is diode-connected.

2. The ring oscillator of claim 1, wherein the third, fourth, fifth and sixth transistors are PMOS transistors.

3. The ring oscillator of claim 1, wherein the replica cell further includes an operational amplifier having:
- an output coupled to respective gate terminals of the third and fifth transistors;
- a first input coupled to a reference signal level; and
- a second input coupled to the drain terminal of the first transistor.

4. The ring oscillator of claim 3, wherein the replica cell further includes a current source connected to a tail of the differential transistor pair to provide a bias current for the differential transistor pair.

5. The ring oscillator of claim 4, wherein the current source is a variable current source coupled to be controlled by an input signal for the ring oscillator.

6. The ring oscillator of claim 5, wherein the output of the operational amplifier provides a bias signal level to active resistors of the delay cells.

7. The ring oscillator of claim 6, wherein the input signal for the ring oscillator is coupled to control variable current sources of the delay cells.

8. The ring oscillator of claim 7, wherein each of the delay cells includes a respective differential transistor pair coupled between respective active resistors of the delay cell and a respective variable current source of the delay cell.

9. The ring oscillator of claim 1, wherein the first and second transistors are NMOS transistors.

10. The ring oscillator of claim 1, wherein:
- the first terminal of the first transistor is a drain terminal, the second terminal of the first transistor is a gate terminal and the third terminal of the first transistor is a source terminal; and
- the first terminal of the second transistor is a drain terminal, the second terminal of the second transistor is a gate terminal and the third terminal of the second transistor is a source terminal.

11. A system comprising:
- an optical transmitter circuit; and
- a clock circuit coupled to the optical transmitter circuit;
- wherein the clock circuit includes:
  - a first oscillator;
  - a first phase locked loop (PLL); and
  - a second PLL coupled between the first oscillator and the first PLL;
- the second PLL including a ring oscillator, the ring oscillator including:
  - a plurality of delay cells coupled in series as a ring; and
  - a replica cell coupled to the delay cells to provide at least one bias signal to the delay cells, the replica cell including a differential transistor pair formed of a first transistor and a second transistor, the first transistor having a first terminal and a second terminal coupled to the first terminal, the second transistor having a first terminal and a second terminal coupled to the first terminal of the second transistor, the first transistor also having a third terminal and the second transistor also having a third terminal coupled to the third terminal of the first transistor;
- wherein the replica cell further includes:
  - a first active resistor connected between a power supply and the drain terminal of the first transistor; and
  - a second active resistor connected between the power supply and the drain terminal of the second transistor;
- wherein:
  - the first active resistor includes a third transistor coupled in parallel with a fourth transistor that is diode-connected; and
  - the second active resistor includes a fifth transistor coupled in parallel with a sixth transistor that is diode-connected.

12. The system of claim 11, wherein the replica cell further includes an operational amplifier having:
- an output coupled to respective gate terminals of the third and fifth transistors;
- a first input coupled to a reference signal level; and
- a second input coupled to the drain terminal of the first transistor.

13. The system of claim 12, wherein the replica cell further includes a current source connected to a tail of the differential transistor pair to provide a bias current for the differential transistor pair.

14. The system of claim 11, wherein:
- the first terminal of the first transistor is a drain terminal, the second terminal of the first transistor is a gate terminal and the third terminal of the first transistor is a source terminal; and
- the first terminal of the second transistor is a drain terminal, the second terminal of the second transistor is a gate terminal and the third terminal of the second transistor is a source terminal.

* * * * *